(12) United States Patent
DuPre et al.

(10) Patent No.: US 6,243,253 B1
(45) Date of Patent: *Jun. 5, 2001

(54) SURFACE MOUNT MULTILAYER CAPACITOR

(75) Inventors: David A. DuPre; John L. Galvagni; Andrew P. Ritter, all of Surfside Beach, SC (US)

(73) Assignee: AVX Corporation, Myrtle Beach, SC (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/264,124

(22) Filed: Mar. 8, 1999

Related U.S. Application Data

(63) Continuation of application No. 08/884,597, filed on Jun. 27, 1997, now Pat. No. 5,880,925.

(51) Int. Cl.$^7$ ............................. H01G 4/228; H01G 4/06; H01G 4/20

(52) U.S. Cl. .................. 361/306.3; 361/313; 361/321.2; 361/301.4

(58) Field of Search ...................................... 361/303, 304, 361/305, 306.1, 306.2, 306.3, 308.1, 310, 311, 312, 313, 321.1, 321.5, 301.4, 309, 322, 329

(56) References Cited

U.S. PATENT DOCUMENTS

| | | |
|---|---|---|
| 3,308,359 | 3/1967 | Hayworth et al. . |
| 3,612,963 | 10/1971 | Piper et al. . |
| 3,822,397 | 7/1974 | Puppolo et al. . |
| 3,971,970 | 7/1976 | Voyles et al. . |
| 4,074,340 * | 2/1978 | Leigh .................................. 361/321.3 |
| 4,274,124 | 6/1981 | Feinberg et al. . |
| 4,328,530 | 5/1982 | Bajorek et al. . |
| 4,346,429 | 8/1982 | DeMatos . |
| 4,419,714 | 12/1983 | Locke . |
| 4,430,690 | 2/1984 | Chance et al. . |
| 4,665,465 | 5/1987 | Tanabe . |
| 4,706,162 | 11/1987 | Hernandez et al. . |
| 4,814,940 | 3/1989 | Horstmann et al. . |

(List continued on next page.)

FOREIGN PATENT DOCUMENTS

| | | |
|---|---|---|
| 0191668 | 8/1986 | (EP) . |
| 6260364 | 9/1994 | (JP) . |

OTHER PUBLICATIONS

Translation of EPO Patent No. 0 191 668, Published Aug. 20, 1986.

Translation of Japanese Patent No. 6260364, Published Sep. 16, 1994.

A paper entitled "Technical Information: Low Inductance Capacitors for Digital Circuits" by John Galvagni of AVX Corporation, Myrtle Beach, SC No Date.

A paper entitled "Technical Information: Advanced Decoupling Using Ceramic MLC Capacitors" by John D. Prymak of AVX Corporation, Olean, NY No Date.

*Primary Examiner*—Dean A. Reichard
*Assistant Examiner*—Eric Thomas
(74) *Attorney, Agent, or Firm*—Dority & Manning, P.A.

(57) ABSTRACT

A multilayer ceramic device suitable for use in surface mount decoupling applications may have a single capacitor or a capacitor array. The device has a capacitor body defining a plurality of electrical terminals on an outer surface thereof. The terminals are interdigitated such that a respective first polarity terminal will be adjacent to a respective second polarity terminal (and vice versa). The capacitor body contains a plurality of interleaved capacitor plates in opposed and spaced apart relation. Capacitor plates of the first polarity are electrically connected to respective first polarity terminals via a plurality of lead structures. Likewise, a plurality of lead structures electrically connect capacitor plates of the second polarity to respective second polarity terminals.

5 Claims, 5 Drawing Sheets

U.S. PATENT DOCUMENTS

| | | | |
|---|---|---|---|
| 4,831,494 | * | 5/1989 | Arnold et al. .................... 361/306.3 |
| 4,852,227 | | 8/1989 | Burks . |
| 4,853,826 | | 8/1989 | Hernandez . |
| 4,862,318 | | 8/1989 | Galvagni et al. . |
| 4,947,286 | | 8/1990 | Kaneko et al. . |
| 5,034,709 | * | 7/1991 | Azumi et al. ....................... 333/184 |
| 5,173,670 | * | 12/1992 | Naito et al. ......................... 333/184 |
| 5,430,605 | | 7/1995 | deNeuf et al. . |
| 5,495,387 | * | 2/1996 | Mandai et al. ...................... 361/328 |
| 5,517,385 | | 5/1996 | Galvagni et al. . |
| 5,793,601 | * | 8/1998 | Nakamura et al. ............... 361/321.4 |
| 5,815,367 | * | 9/1998 | Askura et al. ...................... 361/303 |
| 5,822,174 | * | 10/1998 | Yamate et al. ...................... 361/302 |
| 5,880,925 | * | 3/1999 | DuPre' et al. ....................... 361/303 |

* cited by examiner

SURFACE MOUNT MULTILAYER CAPACITOR

This is a continuation of application Ser. No. 08/884,597, filed Jun. 27, 1997, now U.S. Pat. No. 5,880,925.

BACKGROUND OF THE INVENTION

The present invention relates generally to the art of multilayer capacitors. In a particular aspect, the present invention relates to an improved multilayer ceramic capacitor (MLC) suitable for use as a surface mount decoupling capacitor.

Various electronic equipment will often utilize decoupling capacitors electrically connected between semiconductor chips and their associated power supply. These capacitors function as a reservoir of energy during transients caused by switching within the semiconductor chip. While typically located near the chips, decoupling capacitors are often separate capacitor devices. For various reasons, surface-mount compatible MLCs have seen widespread use for this purpose.

MLCs are generally constructed having a plurality of ceramic-electrode layers arranged in a stack. During manufacture, the stacked ceramic-electrode layers are pressed and sintered to achieve a substantially unitary capacitor body. The capacitor body is often rectangular in shape, with electrical terminals of opposite polarity provided along respective sides or at opposite ends.

SUMMARY OF THE INVENTION

The present invention recognizes various disadvantages of prior art constructions and methods. Accordingly, it is an object of the present invention to provide an improved capacitor device.

It is more particular object of the present invention to provide an improved multilayer ceramic capacitor.

It is a specific object of the present invention to provide an improved surface mount compatible decoupling capacitor for use in electronic equipment.

It is also an object of the present invention to provide a novel capacitor array structure.

Some of these objects are achieved by a multilayer capacitor device suitable for use as a surface mount decoupling capacitor. The capacitor device comprises a capacitor body including a plurality of first and second electrode plates interleaved in opposed and spaced apart relation. The capacitor body is low-aspect, and may have an aspect ratio of less than about 0.5:1. A dielectric material located between each opposing set of electrode plates provides a predetermined dielectric constant.

The first and second electrode plates each include a main electrode portion and a plurality of spaced apart lead structures extending therefrom. Respective lead structures of the first electrode plates are located adjacent respective lead structures of the second electrode plates in an interdigitated arrangement.

Corresponding lead structures of respective first electrode plates are electrically connected together. Likewise, corresponding lead structures of respective second electrode plates are also electrically connected together. This construction thus defines a plurality of electrical terminals of a first polarity and a plurality of electrical terminals of a second polarity. The electrical terminals may be formed by a thick-film terminal material.

Each lateral side of the main electrode portions may have an equal number of lead structures extending therefrom. In an exemplary construction, each lateral side has a total of two lead structures extending therefrom. In such embodiments, respective lead structures extending from one of the lateral sides may be offset by one terminal position in relation to respective lead structures extending from the opposite lateral side. In addition, a first single lead structure may extend from an end of the main electrode portion of the first electrode plates and a second single lead structure may extend from the main electrode portion of the second electrode plate.

Other objects of the present invention are achieved by an electrical circuit arrangement comprising a generally planar circuit board having a plurality of electrical current paths defined thereon. The arrangement further includes a capacitor device having a capacitor body surface mounted on the circuit board. Electrical terminals of the capacitor body are in respective electrical communication with predetermined of the current paths.

The capacitor body includes at least one first electrode plate and at least one second electrode plate situated in opposed and spaced apart relation, the electrode plates being situated in a plane substantially parallel to a plane of the circuit board. The first electrode plate has a generally rectangular first main electrode portion with a plurality of first lead structures extending therefrom. Similarly, the second electrode plate has a generally rectangular second main electrode portion with a plurality of second lead structures extending therefrom. Respective of the first lead structures are located adjacent respective of the second lead structures in an interdigitated arrangement. A ceramic material is located between each opposing set of first and second electrode plates to provide a predetermined dielectric constant.

The electrical terminals may be located on at least one lateral side of the capacitor body. For example, the electrical terminals may be located on both lateral sides of the capacitor body. Preferably, the electrical terminals are electrically connected to current paths utilizing eutectic solder.

Each lateral side of the first main electrode portions may have an equal number of the first lead structures. Likewise, each lateral side of the second main electrode portions may also have an equal number of the second lead structures. First and second lead structures located on opposite lateral sides of the respective first and second main electrode portion may be offset by one terminal position in relation to each other.

In presently preferred embodiments, the capacitor body has an aspect ratio of no more than approximately 1:1. The capacitor body may, for example, have an aspect ratio of no more than approximately 0.5:1.

Still further objects of the present invention are achieved by a multilayer ceramic capacitor comprising a capacitor body having a low aspect ratio, such as an aspect ratio of no more than 0.5:1. The capacitor body is constructed having a unitary structure characteristic of a plurality of stacked, pressed and sintered ceramic-electrode layers. A plurality of first polarity electrical terminals and a plurality of second polarity electrical terminals are located on the outer surface of the capacitor body. The terminals are formed by a thick-film terminal material.

Each ceramic-electrode layer includes an electrode plate having a main electrode portion with a plurality of lead structures extending therefrom. The electrode plates are interleaved such that respective lead structures of first alternating electrode plates are electrically connected to first polarity terminals and respective lead structures of second alternating electrode plates are electrically connected to second polarity terminals. The capacitor is constructed and arranged to exhibit an inductance of less than approximately 100 picohenries.

In some presently preferred embodiments, respective lead structures of the first alternating electrode plates are located adjacent to respective lead structures of the second alternating electrode plates in an interdigitated arrangement. In such embodiments, the capacitor body may have a generally rectangular configuration defining lateral sides of greater dimension and end sides of lesser dimension. Respective lateral sides may each have an equal number of first polarity terminals and second polarity terminals. For example, each lateral side may have two first polarity terminals and two second polarity terminals.

Still further objects of the invention are achieved by a capacitor array having a plurality of capacitor devices in a surface mount compatible package. The array comprises a capacitor body having a unitary structure characteristic of a plurality of stacked, pressed and sintered ceramic-electrode layers. The ceramic electrode layers comprise a plurality of first ceramic-electrode layers and a plurality of second ceramic-electrode layers. The capacitor body further includes a plurality of first polarity electrical terminals and a plurality of second polarity electrical terminals located on the outer surface thereof.

The first ceramic-electrode layers each include an electrode plate having a first main electrode portion with a plurality of first lead structures extending therefrom. The second ceramic-electrode layers each include a plurality of coplanar second electrode plates situated in opposed and spaced apart relation to the first electrode plate. The second electrode plates each have a second main electrode portion with at least one second lead structure extending therefrom.

Respective first lead structures are located adjacent to respective second lead structures in an interdigitated arrangement. Each of the lead structures extends to respective electrical terminals such that the capacitor array has a number of capacitor devices equal to a number of the second electrode plates.

Other objects, features and aspects of the present invention are provided by various combinations and subcombinations of the disclosed elements, which are discussed in greater detail below.

BRIEF DESCRIPTION OF THE DRAWINGS

A full and enabling disclosure of the present invention, including the best mode thereof, to one of ordinary skill in the art, is set forth more particularly in the remainder of the specification, including reference to the accompanying drawings, in which.

Figure 1:
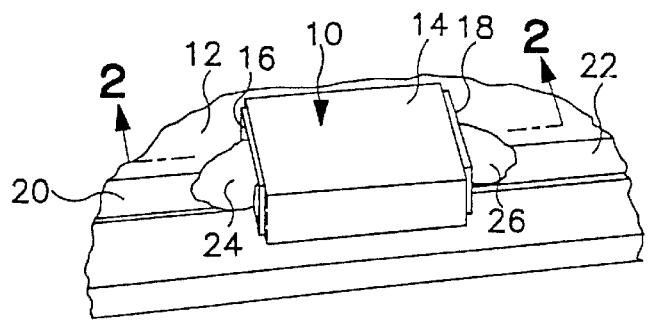
FIG. 1 is a perspective view of a prior art MLC device in position on a printed circuit board.

Repeat use of reference characters in the present specification and drawings is intended to represent same or analogous features or elements of the invention.

DETAILED DESCRIPTION OF PREFERRED EMBODIMENTS

It is to be understood by one of skill in the art that the present discussion is a description of exemplary embodiments only, and is not intended as limiting the broader aspects of the present invention, which broader aspects are embodied in the exemplary constructions.

In order to place the teachings of the present invention in context, prior art related to surface-mount decoupling capacitors will now be discussed in greater detail. Thus, FIG. 1 illustrates a prior art MLC device 10 mounted to a printed circuit board 12. Device 10 includes a capacitor body 14 having terminals 16 and 18 of opposite polarity located at the respective ends thereof. Terminals 16 and 18 are typically formed as thick film terminals in a manner known in the art.

Terminals 16 and 18 are electrically connected to respective conductive paths 20 and 22 defined on the surface of printed circuit board 12. Electrical connection between each terminal and its associated conductive path may be effected by respective solder beads 24 and 26. Typically, circuit board 12 may be made from a low-temperature organic material, with the solder being a low temperature eutectic solder applied by wave or reflow soldering techniques.

The external dimensions of an MLC will often be very small in relation to other types of capacitors. According to industry practice, the size of device 10 is generally expressed as a number "XXYY," with XX and YY being the width or length in hundredths of an inch. The side, i.e, width or length, to which the terminals are applied is XX, with YY expressing the other dimension. Some typical sizes of capacitor body 14 under this practice are 0612, 1012, 0508, 0306 and 1218. In addition, capacitor body 14 will typically have a low aspect ratio, defined as the ratio of the height to the longer of the width or the length. Aspect ratios of less than 1:1, and often less than 0.5:1, are not uncommon.

Figure 2:
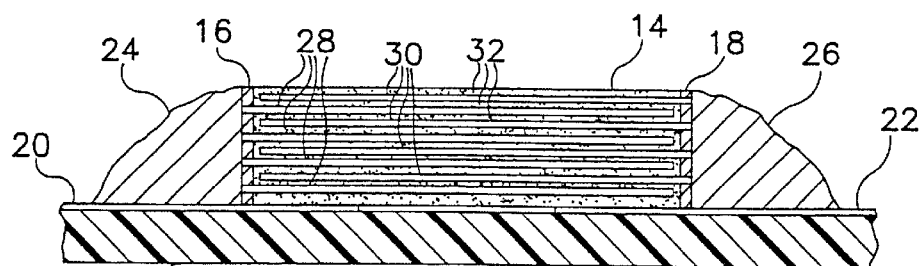
FIG. 2 is a cross sectional view of the prior art MLC device of FIG. 1 as taken along line 2—2.

Referring now to FIG. 2, the internal construction of capacitor body 14 will be explained. As can be seen, capacitor body 14 includes a plurality of first electrode plates 28 interleaved in opposed and spaced apart relation with a plurality of second electrode plates 30. The electrode plates are separated by layers (such as layers 32) of ceramic material to provide a predetermined dielectric constant. Capacitor body 14 is typically made by stacking ceramic-electrode layers formed using conventional dicing techniques, which are then pressed and sintered in a kiln.

As shown, all of electrode plates 28 are electrically connected to terminal 16. In a similar manner, electrode plates 30 are electrically connected to terminal 18. As a result, device 10 functions as multiple two-plate capacitors arranged in parallel.

Figure 3:
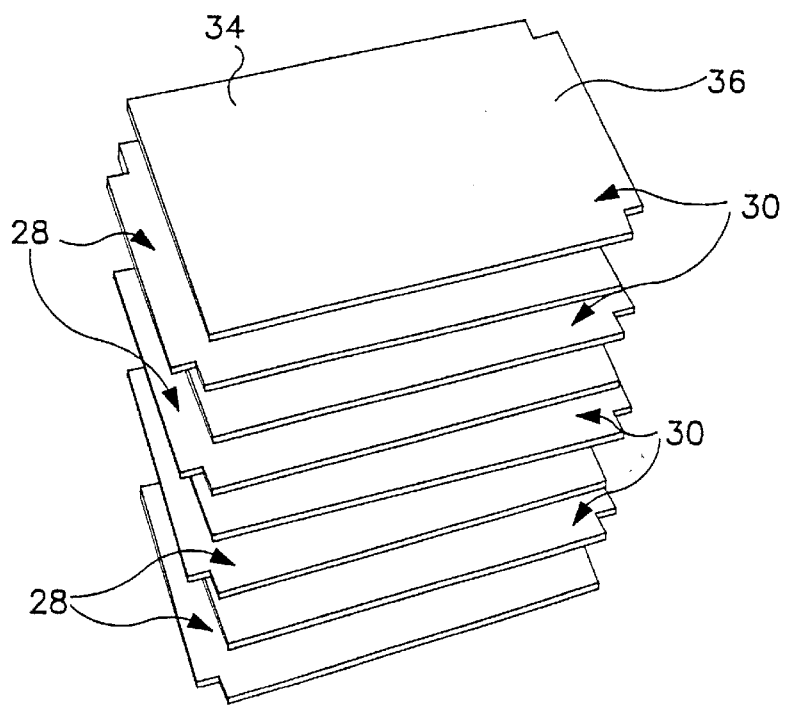
FIG. 3 is an exploded perspective view of the plurality of electrode plates utilized in the prior art MLC device of FIG. 1.

The specific configuration of electrode plates 28 and 30 is readily apparent in FIG. 3. Electrode plates 30 each include a main electrode portion 34 and a tab portion 36. Tab portion 36 functions as a lead structure to provide the desired electrical connection with terminal 18. Electrode plates 28 are similarly constructed, except that the tab portion extends from the opposite end of the main electrode portion to provide electrical connection with terminal 16.

Various devices of the present invention will now be discussed with reference to the remaining figures. In many cases, these devices may be utilized in lieu of the prior art devices as described above. Thus, it will often be desirable that external dimensions, aspect ratios and the like remain as similar to the prior art as practicable.

Figure 4:
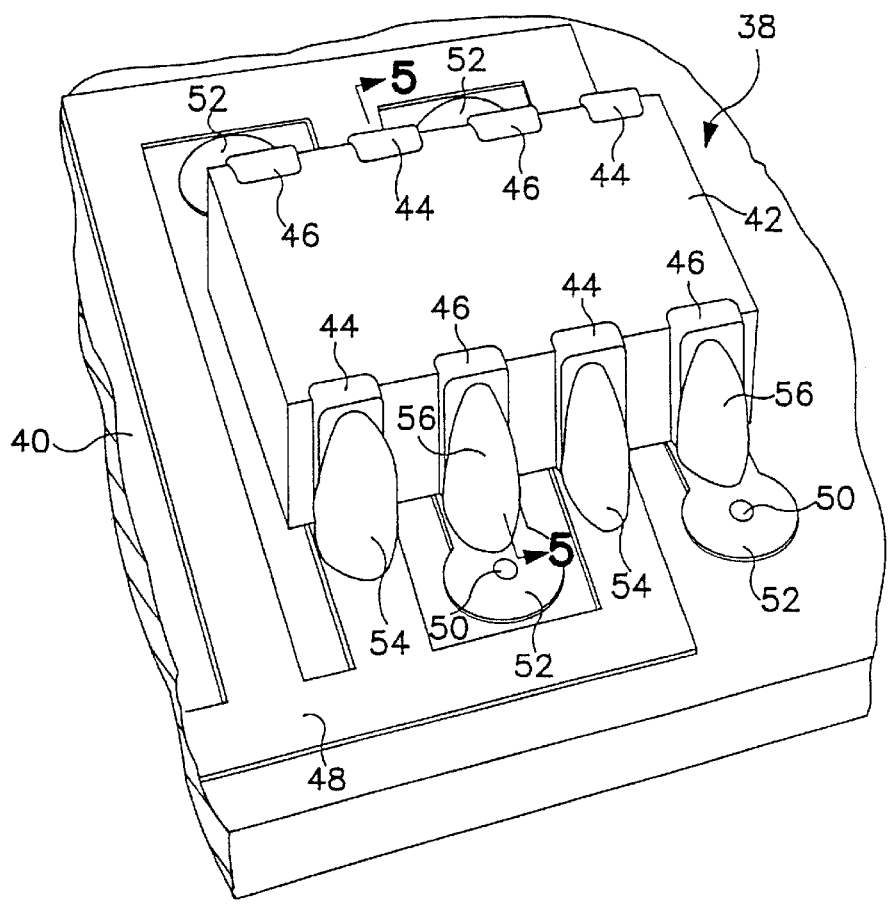
FIG. 4 is a perspective view of a MLC device constructed in accordance with the present invention in position on a printed circuit board.

FIG. 4 illustrates a MLC device 38 mounted to a printed circuit board 40. Device 38 includes a capacitor body 42 having a plurality of first polarity terminals 44 and a plurality of second polarity terminals 46. In this case, each lateral side of capacitor body 42 includes a pair of first polarity terminals 44 and a pair of second polarity terminals 46. Terminals 44 and 46 are typically produced using thick film application techniques.

As can be seen, the opposite polarity terminals located on each lateral side of capacitor body 42 are interdigitated such that a first polarity terminal 44 will always be adjacent to at least one second polarity terminal 46 (and vice versa). In addition, terminals of like polarity located on opposite lateral sides of capacitor body 42 are offset by one terminal position. Thus, a first polarity terminal 44 on one lateral side of capacitor body 42 will be situated across from a second polarity terminal 46 located on the opposite lateral side.

In this case, a conductive path 48 may be defined on the top surface of printed circuit board 40 so that terminals 44 will be electrically connected to one another. Terminals 46 are electrically connected to one another by a similar conductive path located on the bottom surface of printed circuit board 40. Vias 50 extend up through printed circuit board 40 to respective traces 52, which provide final connection to the respective terminals 46.

Respective solder beads 54 may be provided for terminals 44, with similar solder beads 56 being provided for each of terminals 46. In part because printed circuit board 40 will often be made from a low temperature organic material, solder beads 54 and 56 are preferably produced by a low temperature eutectic solder applied through wave or reflow soldering techniques.

Figure 5:
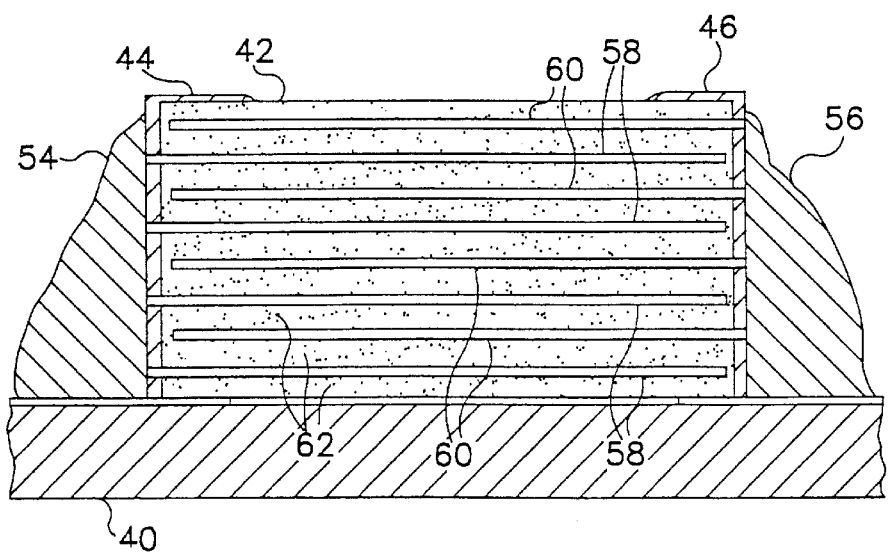
FIG. 5 is a cross sectional view of the MLC device of FIG. 4 as taken along line 5—5.

Referring now to FIG. 5, capacitor body 42 contains a plurality of first electrode plates 58 interleaved in opposed and spaced apart relation with a plurality of second electrode plates 60. Electrode plates 58 are electrically connected to each of terminals 44, whereas electrode plates 60 are electrically connected to terminals 46. Like prior art device 10, the electrode plates are preferably separated by layers of ceramic material, such as layers 62. Also similar to device 10, capacitor body 42 may be formed of stacked ceramic-electrode layers which are pressed and sintered in a kiln to yield a substantially unitary construction.

Figure 6:
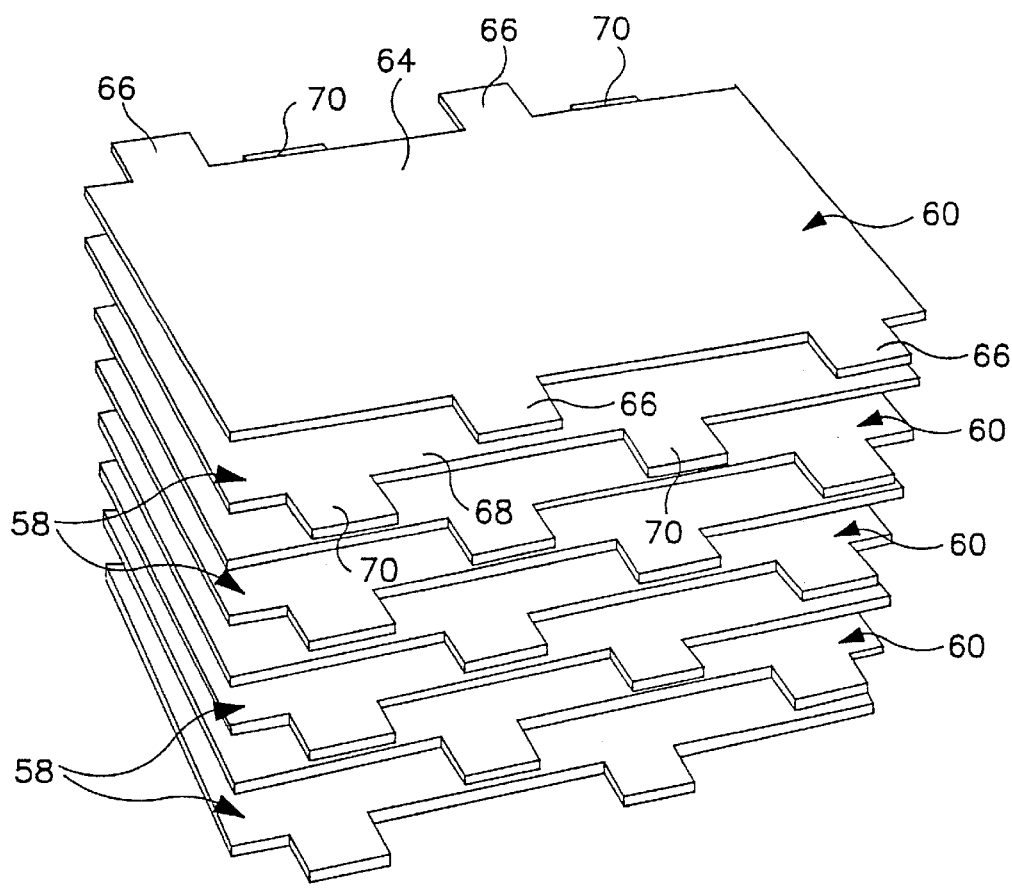
FIG. 6 is an exploded perspective view of the plurality of electrode plates utilized in the MLC device of FIG. 4.
Figure 7:
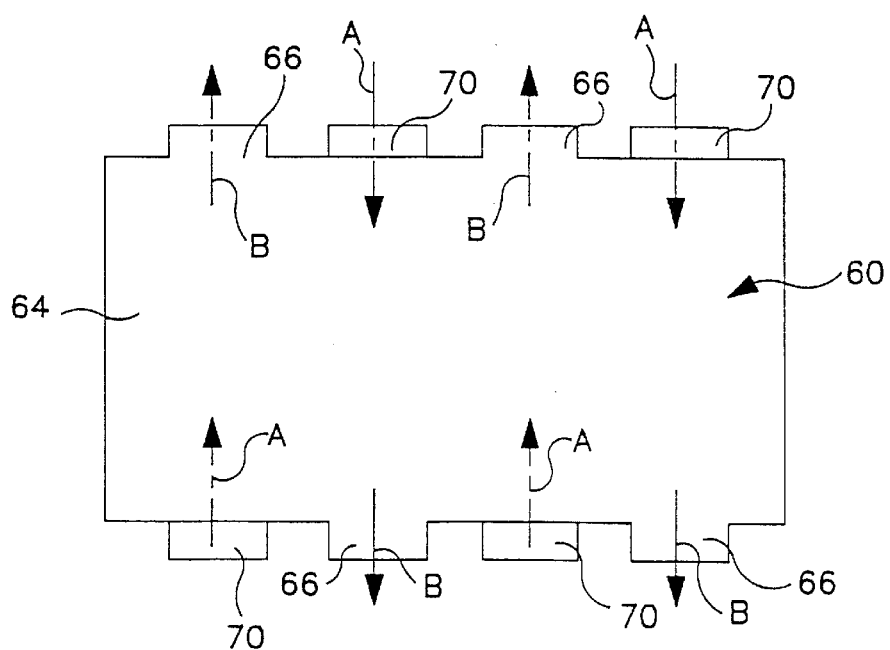
FIG. 7 is a plan view of a first electrode plate stacked above a second electrode plate as in the MLC device of FIG. 4 to illustrate the lead structure thereof.

The configuration of electrode plates 58 and 60 may be explained with reference to FIGS. 6 and 7. As can be seen, electrode plates 60 each include a main electrode portion 64 having a plurality of lead structures 66 extending therefrom.

Each electrode plate 58 also has a main electrode portion 68 in register with main electrode portions 64. A plurality of lead structures 70 extend from each of the main electrode portions 68.

It will be appreciated that lead structures 66 connect to terminals 46, while lead structures 70 connect to terminals 44. Accordingly, respective lead structures 66 will be interdigitated with respective lead structures 70 in a manner similar to terminals 44 and 46. The interdigitated lead structures provide multiple, adjacent current injection points onto the associated main electrode portion. Current travelling in opposite directions, as indicated by arrows A and B of FIG. 7, will tend to cancel mutual inductance that could otherwise develop.

As a particular advantage of this arrangement, device 38 will generally have a very low inductance in comparison with device 10 of similar dimensions. For example, many embodiments of the present invention will exhibit an inductance of less than 100 picohenries. The offset nature of lead structures on opposite lateral sides of each electrode plate also reduces mutual inductance levels.

While additional lead structures may further reduce mutual inductance, each electrode plate of device 38 includes four lead structures for production and cost considerations. It is desirable, however, that adjacent lead structures remain in close proximity to facilitate field cancellation. For example, adjacent lead structures will often be no more than 0.03 inches apart.

Figure 8:
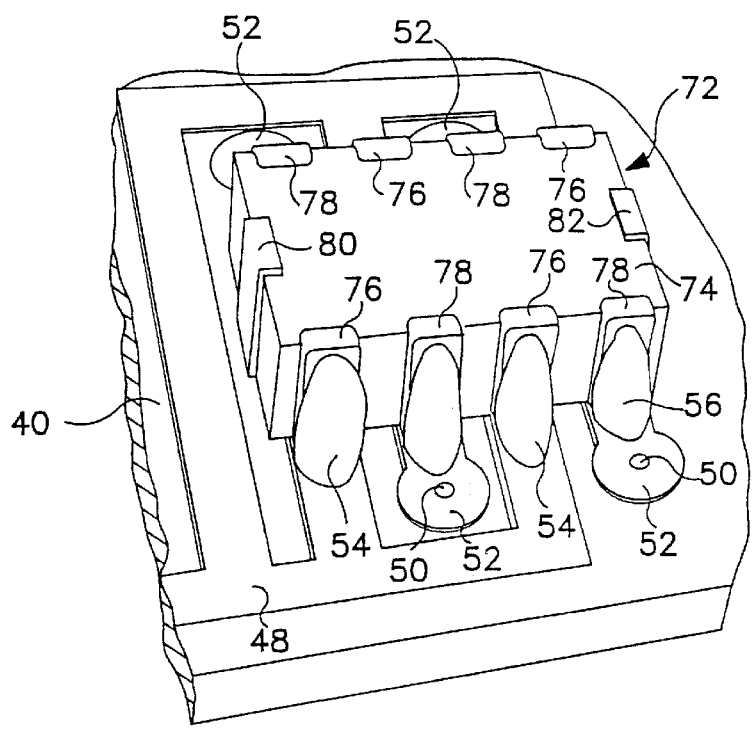
FIG. 8 is a view similar to FIG. 4 illustrating a first alternative embodiment of a MLC device constructed in accordance with the present invention.

FIG. 8 illustrates a MLC device 72 similar in construction to device 38. For example, MLC device 72 includes a capacitor body 74 having a plurality of first polarity terminals 76. Like device 38, device 72 includes a plurality of second polarity terminals 78 are interdigitated with terminals 76.

In addition, however, capacitor body 74 includes a first end terminal 80 and a second end terminal 81 of opposite polarity. While circuit board 40 may be adapted to permit connection of terminals 80 and 81 to the overall circuit, it has not been so adapted in the illustrated construction. Thus, terminals 80 and 81 remain unconnected to the current paths of circuit board 40 during use. Even in this case, however, terminals 80 and 81 are advantageous to permit testing of device 72 during manufacture with test equipment previously used to test prior art devices as shown in FIGS. 1–3.

Figure 9A:
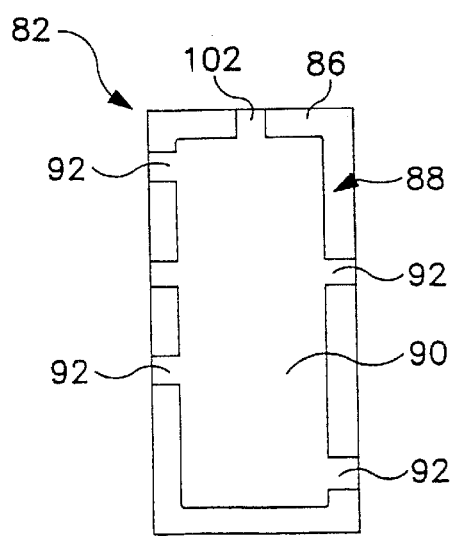
FIGS. 9A, and 9B illustrate respective layers as may be stacked in the production of the MLC device of FIG. 8.
Figure 9B:
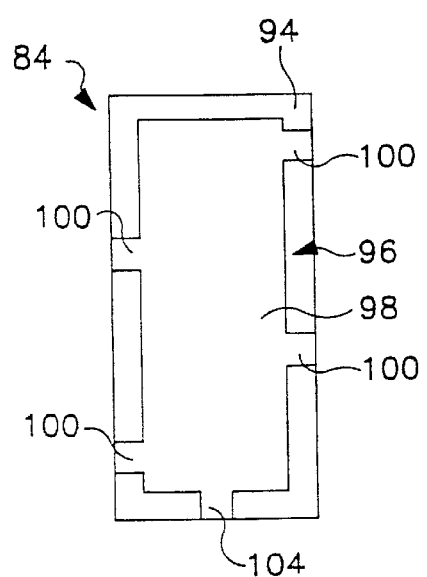

FIGS. 9A and 9B illustrate respective ceramic-electrode layers 82 and 84 that may be stacked in an interleaved arrangement in the production of MLC device 72. Layer 82 includes a ceramic substrate 86 having thereon a first electrode plate 88. Electrode plate 88 defines a main electrode portion 90 and a plurality of tab portions 92 extending from lateral sides thereof. Similarly, layer 84 includes a ceramic substrate 94 and a second electrode plate 96. Electrode plate 96 defines a main electrode portion 98 from which a plurality of tab portions 100 extend.

It will be appreciated that the structure of ceramic-electrode layers 82 and 84 as described thus far is similar to the ceramic-electrode layers from which MLC device 38 may be produced. In this case, however, main electrode portions 90 and 98 further define tabs 102 and 104 at respective opposite ends. Each of tabs 102 in the overall capacitor body extend to terminal 80, whereas tabs 104 each extend to terminal 82.

Devices 38 and 72 are illustrative of exemplary discrete capacitor components that may be constructed according to the present invention. As will now be described, however, aspects of the present invention are useful in the production of capacitor arrays, i.e., multiple capacitor devices contained within a unitary package. The body containing the capacitor array may have a similar configuration as the embodiments previously discussed. One skilled in the art will also appreciate that such an array will be mounted to a printed circuit in a similar manner.

Figure 10A:
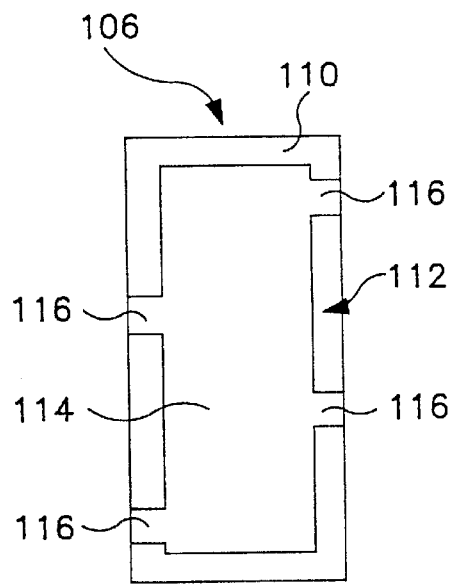
FIGS. 10A and 10B illustrate respective layers as may be stacked in the production of a MLC capacitor array constructed in accordance with the present invention.
Figure 10B:
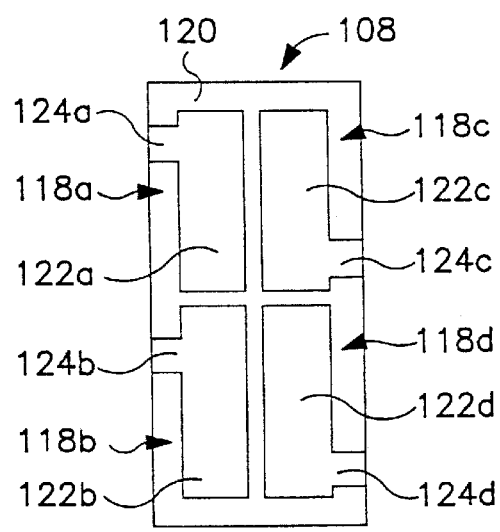

FIGS. 10A and 10B show respective ceramic-electrode layers 106 and 108 that may interleaved in a stack of similar layers to produce a capacitor array having an external appearance indistinguishable from that of device 38. Layer 106 includes a ceramic substrate 110 having a single electrode plate 112 thereon. Plate 112 defines a main electrode portion 114 from which a plurality of tab portions 116 extend.

Layer 108, on the other hand, includes a plurality of electrode plates 118a–d located on ceramic substrate 120. Each of plates 118a–d includes a respective main electrode portion 122a–d, from which a single tab portion 124a–d extends. It will be appreciated that each of plates 118a–d operates in conjunction with opposed plate 114 to yield an individual capacitor. Thus, the overall device will have a number of capacitors equal to the number of such plates 118.

Figure 11A:
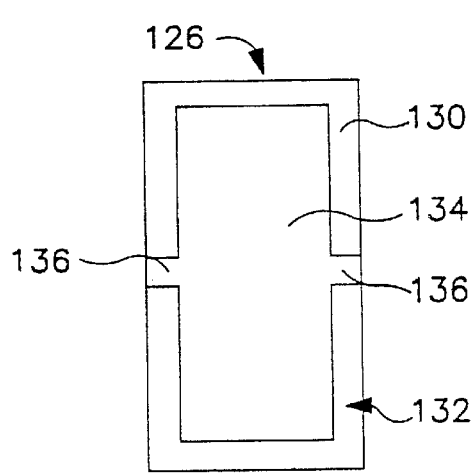
FIGS. 11A and 11B illustrate respective layers as may be stacked in the production of an alternative embodiment of a MLC capacitor array constructed in accordance with the present invention.
Figure 11B:
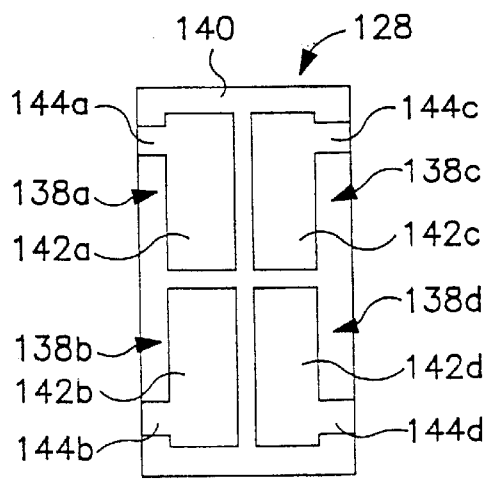

FIGS. 11A and 11B illustrate respective ceramic-electrode layers 126 and 128 as may be utilized in an alternative array structure having a slightly modified "footprint." In particular, the array of this embodiment would have a total of three terminals on each lateral side of the capacitor body. Such an embodiment may be desirable in applications requiring a relatively small package size, such as 0805 or smaller.

In this case, layer 126 includes a ceramic substrate 130 having thereon an electrode plate 132. Plate 132 defines a main electrode portion 134, from which a pair of tab portions 136 extend. It can be seen that the respective tab portions 136 are located directly opposite to one another across main electrode portion 134. Layer 128, on the other hand, includes a plurality of electrode plates 138a–d located on a ceramic substrate 140. Electrode plates 138a–d define a respective main electrode 142a–d from which a single tab portion 144a–d extends.

It can thus be seen that the present invention provides improved capacitor devices that accomplish the various objectives set forth above. While preferred embodiments of the invention have been shown and described, modifications and variations may be made thereto by those of ordinary skill in the art without departing from the spirit and scope of the invention, which is more particularly set forth in the appended claims. In addition, it should be understood that aspects of the various embodiments may be interchanged both in whole or in part. Furthermore, those of ordinary skill in the art will appreciate that the foregoing description is by way of example only, and is not intended to be limitative of the invention so further described in such appended claims.

What is claimed is:

1. A multilayer ceramic capacitor comprising:
    (a) a capacitor body of generally rectangular configuration defining a top surface, a bottom surface, two side surfaces and two end surfaces;
    (b) said capacitor body having a unitary structure made from a plurality of stacked, pressed and sintered ceramic-electrode layers, said ceramic-electrode layers comprising a plurality of first ceramic-electrode layers and a plurality of second ceramic-electrode layers;
    (c) said first ceramic-electrode layers each including a first electrode plate having a main electrode portion with at least two first lead structures extending from each lateral side such that said first lead structures along one lateral side are offset from said first lead structures along the opposite lateral side, and at least one first lead structure extending from one end side of said main electrode portion of said first electrode plate;
    (d) said second ceramic-electrode layers each including a second electrode plate having a main electrode portion with at least two second lead structures extending from each lateral side such that said second lead structures along one lateral side are offset from said second lead structures along the opposite lateral said, and at least one second lead structure extending from an end side of said main electrode portion of said electrode plate that is opposite from said side of said first electrode plates having said end first lead structures;
    (e) a plurality of surface mount electrical terminals, said electrical terminals being located on said side surface and said end surfaces of said capacitor body;
    (f) said first and second ceramic-electrode layers disposed in an alternating stacked configuration such that said first lead structures of said first electrode plates along respective sides of said plates are vertically aligned and offset from said second lead structures of said second electrode plates which are vertically aligned along said respective sides, said vertical stacks of first and second lead structures being interdigitated along said respective sides and electrically connected to different ones of said electrical terminals, said end first lead structures of said first electrode plates being vertically aligned and connected to a common said electrical terminal and said end second lead structures of said second electrode plates being vertically aligned and connected to a common electrical terminal; and
    (g) wherein each of said side surfaces of said capacitor body has adjacent said electrical terminals of opposite polarity, and each of said end surfaces has at least one said electrical terminal of opposite polarity to that of the other said end surface.

2. A multilayer ceramic capacitor as set forth in claim 1, wherein each of said surfaces of said capacitor body has a total of four of said electrical terminals located thereon, said electrical terminals being arranged in two pairs of opposite polarity.

3. A multilayer ceramic capacitor as set forth in claim 2, wherein said electrical terminals are formed by a thick-film terminal material.

4. A multilayer ceramic capacitor as set forth in claim 3, wherein said capacitor body has an aspect ratio of no more than 0.5:1.

5. A multilayer ceramic capacitor as set forth in claim 4, wherein a centerline spacing between adjacent of said electrical terminals located on said side surfaces of said capacitor body is no greater than approximately 0.03 inches.

* * * * *

UNITED STATES PATENT AND TRADEMARK OFFICE
CERTIFICATE OF CORRECTION

PATENT NO.   : 6,243,253 B1
DATED        : June 5, 2001
INVENTOR(S)  : David A. DuPre, John L. Galvagni and Andrew P. Ritter It is certified that error appears in the above-identified patent and that said Letters Patent is hereby corrected as shown below:

Column 8,
Line 17, delete "said" and add -- side --.

Signed and Sealed this

Tenth Day of December, 2002

JAMES E. ROGAN
*Director of the United States Patent and Trademark Office*